(12) United States Patent
Kim et al.

(10) Patent No.: US 10,754,384 B2
(45) Date of Patent: Aug. 25, 2020

(54) DISPLAY DEVICE

(71) Applicant: Samsung Display Co., Ltd., Yongin-si (KR)

(72) Inventors: Taeeun Kim, Yongin-si (KR); Yunoh Nam, Hwaseong-si (KR); Younbum Lee, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 29 days.

(21) Appl. No.: 16/251,082

(22) Filed: Jan. 18, 2019

(65) Prior Publication Data

US 2019/0227597 A1    Jul. 25, 2019

(30) Foreign Application Priority Data

Jan. 19, 2018    (KR) .......................... 10-2018-0007346

(51) Int. Cl.
| | | |
|---|---|---|
| *G06F 3/041* | (2006.01) | |
| *G06F 1/16* | (2006.01) | |
| *G06F 3/0481* | (2013.01) | |
| *H03K 17/96* | (2006.01) | |
| *G06F 3/0488* | (2013.01) | |

(52) U.S. Cl.
CPC .......... *G06F 1/1643* (2013.01); *G06F 3/0412* (2013.01); *G06F 3/0488* (2013.01); *G06F 3/04817* (2013.01); *H03K 17/96* (2013.01); *H03K 2217/96015* (2013.01); *H03K 2217/96031* (2013.01); *H03K 2217/96042* (2013.01)

(58) Field of Classification Search
CPC .. G06F 1/1643; G06F 3/0412; G06F 3/04817; G06F 3/0488; H03K 17/96; H03K 2217/96015; H03K 2217/96031; H03K 2217/96042
See application file for complete search history.

(56) References Cited

U.S. PATENT DOCUMENTS 8,700,098 B2    4/2014   Yang et al.
9,436,302 B2    9/2016   Cho
(Continued)

FOREIGN PATENT DOCUMENTS

KR    10-2012-0122752    11/2012
KR    10-2014-0013615    2/2014
(Continued)

*Primary Examiner* — Robert J Michaud
(74) *Attorney, Agent, or Firm* — H.C. Park & Associates, PLC

(57) ABSTRACT

A display device may include: a window disposed on the display panel, including: a window base including a light transmission portion and a light blocking portion; a light blocking layer disposed on the light blocking portion of the window base, the light blocking layer including a touch key pattern portion; a printed circuit board disposed on the light blocking layer; a touch key light source disposed on the printed circuit board; a first light blocking member disposed on the printed circuit board and the touch key light source, including: a first distal end between the touch key light source and the light transmission portion of the window base; and a second distal end between the touch key light source and an edge of the window base; and a second light blocking member disposed between the second distal end of the first light blocking member and the light blocking layer.

20 Claims, 10 Drawing Sheets

(56) References Cited

U.S. PATENT DOCUMENTS

| 9,846,455 B2 | 12/2017 | Kim | |
|---|---|---|---|
| 2008/0096616 A1* | 4/2008 | Choi | ............ H01H 13/83 455/575.1 |
| 2014/0132854 A1* | 5/2014 | Wu | ............ G06F 1/1626 349/12 |

FOREIGN PATENT DOCUMENTS

| KR | 10-1475870 | 12/2014 |
| KR | 10-1595720 | 2/2016 |
| KR | 10-2016-0022426 | 3/2016 |
| KR | 10-1637875 | 7/2016 |

* cited by examiner

DISPLAY DEVICE

CROSS-REFERENCE TO RELATED APPLICATION

This application claims priority from and the benefit of Korean Patent Application No. 10-2018-0007346, filed on Jan. 19, 2018, which is hereby incorporated by reference for all purposes as if fully set forth herein.

BACKGROUND

Field

Exemplary embodiments/implementations of the invention relate generally to a display device, and more specifically to a display device including a touch key.

Discussion Of The Background

A display device includes a display panel for realizing images and a window for covering the display panel. The display panel may be a self-luminescent type display panel such as an organic light emitting diode ("OLED") display panel, or a non-self-luminescent type display panel such as a liquid crystal display ("LCD") panel, an electro-wetting display panel, an electrophoretic display panel, and a microelectromechanical system ("MEMS") display panel.

The display device may include a touch key on one side of the window so that a user may perform a touch action. A menu key, a cancel key, or the like located at a lower end portion of the window may correspond to the touch key. The display device may further include a touch icon, formed at the touch key, and a touch key light source for providing light to the touch icon. For example, according to the touch action of the user, the light emitted from the touch key light source may be emitted to the outside through the touch icon. However, as the touch key light source is disposed on one side of the window, light leakage may occur in the bezel area.

The above information disclosed in this Background section is only for understanding of the background of the inventive concepts, and, therefore, it may contain information that does not constitute prior art.

SUMMARY

Devices constructed according to exemplary implementations of the invention provide a display device capable of substantially preventing or reducing light leakage caused by a touch key light source.

Additional features of the inventive concepts will be set forth in the description which follows, and in part will be apparent from the description, or may be learned by practice of the inventive concepts.

According to one or more implementations/embodiments of the invention, a display device includes: a display panel; and a window disposed on the display panel, the window including: a window base including a light transmission portion and a light blocking portion; a light blocking layer disposed on the light blocking portion of the window base, the light blocking layer including a touch key pattern portion; a printed circuit board disposed on the light blocking layer; a touch key light source disposed on the printed circuit board; a first light blocking member disposed on the printed circuit board and the touch key light source, the first light blocking member including: a first distal end located between the touch key light source and the light transmission portion of the window base; and a second distal end located between the touch key light source and an edge of the window base; and a second light blocking member disposed between the second distal end of the first light blocking member and the light blocking layer.

The first distal end of the first light blocking member may be attached to the printed circuit board, and the second distal end of the first light blocking member may be attached to the second light blocking member.

Each of the first and second light blocking members may include a black adhesive tape.

At least one surface of each of the first and second light blocking members may include at least one of an acrylic resin, an epoxy resin, a fluororesin, and a polytetrafluoroethylene resin.

The first light blocking member may have an angle in a range from about 5 degrees to about 15 degrees with respect to the window base, between the first distal end of the first light blocking member and the touch key light source.

The first distal end of the first light blocking member may overlap at least a part of the display panel.

The second light blocking member may have a thickness in a range from about 0.10 mm to about 0.80 mm.

The second light blocking member may have a thickness substantially equal to a total thickness of the printed circuit board and the touch key light source.

The second light blocking member may have a thickness in a range from about 0.50 mm to about 0.75 mm.

The second light blocking member may enclose the touch key light source and the touch key pattern portion in a plan view.

The first distal end and the second distal end of the first light blocking member may be attached to the second light blocking member.

The first light blocking member may have a shape substantially the same as a shape of an area defined by the second light blocking member.

The first light blocking member may further include a protruding portion that protrudes from the first distal end of the first light blocking member toward the light transmission portion of the window base, interposed between the touch key light source and the light transmission portion of the window base.

The touch key light source may include two touch key light sources spaced apart from each other with the touch key pattern portion therebetween, and wherein display device may further include a light guide film disposed between the two touch key light sources.

The light guide film may overlap the touch key pattern portion.

According to one or more implementations/embodiments of the invention, a display device includes: a display panel; a window disposed on the display panel; and a housing accommodating the display panel, the window including: a window base including a light transmission portion and a light blocking portion; a light blocking layer disposed on the light blocking portion of the window base, and including a touch key pattern portion; a printed circuit board disposed on the light blocking layer; a touch key light source disposed on the printed circuit board; a first light blocking member disposed on the printed circuit board and the touch key light source, the first light blocking member including: first distal end located between the touch key light source and the light transmission portion of the window base; and second distal end located between the touch key light source and an edge of the window base; and a second light blocking member disposed between the housing and the light blocking layer.

The first distal end of the first light blocking member may be attached to the printed circuit board, and the second distal end of the first light blocking member may be attached to the light blocking layer.

Each of the first and second light blocking members may include a black adhesive tape.

The display device may further include an adhesive disposed adjacent to the second light blocking member, between the housing and the light blocking layer.

The adhesive may be a black adhesive and include a curable material.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
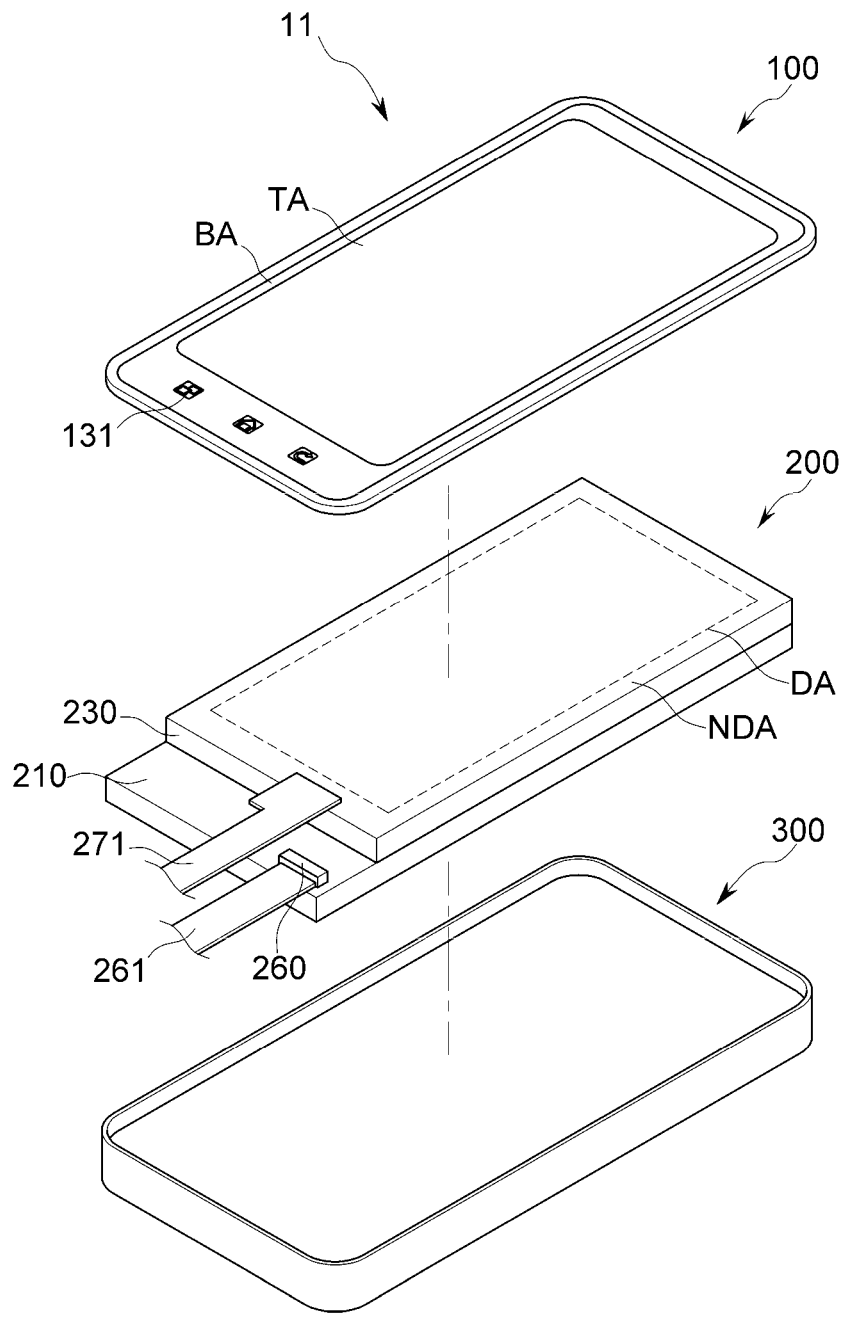
FIG. 1 is an exploded perspective view schematically illustrating a display device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

"About" or "approximately" as used herein is inclusive of the stated value and means within an acceptable range of variation for the particular value as determined by one of ordinary skill in the art, considering the measurement in question and the error associated with measurement of the particular quantity (i.e., the limitations of the measurement system). For example, "about" may mean within one or more standard variations, or within ±30%, 20%, 10%, 5% of the stated value.

As customary in the field, some exemplary embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some exemplary embodiments may be physically separated into two or more interacting and discrete blocks, units, and/or modules without departing from the scope of the inventive concepts. Further, the blocks, units, and/or modules of some exemplary embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, an exemplary embodiment will be described with reference to FIGS. 1, 2, 3, 4, and 5.

FIG. 1 is an exploded perspective view schematically illustrating a display device according to an exemplary embodiment.

Referring to FIG. 1, a display device 11 according to an exemplary embodiment includes a display panel 200, a window 100 disposed on the display panel 200, and a housing 300 accommodating the display panel 200.

The window 100 is disposed on a surface of the display panel 200 from which images are output, and is coupled to the housing 300 to form outer surfaces of the display device 11 together with the housing 300. The window 100 may have a quadrangular plate shape, and the vicinity of a corner of the plate may have a round shape on a plane. In addition, the window 100 may have an edge curved towards the housing 300.

The window 100 includes a light transmission portion TA through which light is transmitted and a light blocking portion BA at which light is blocked. As illustrated in FIG. 1, the light blocking portion BA may surround the light transmission portion TA on a plan view. The display panel 200 may be exposed through the light transmission portion TA of the window 100.

The display panel 200 displays images. There is no particular limitation on the type of the display panel 200. For example, the display panel may be a self-luminescent type display panel such as an organic light emitting diode ("OLED") display panel, or a non-self-luminescent type display panel such as a liquid crystal display ("LCD") panel, an electro-wetting display panel, an electrophoretic display panel, and a microelectromechanical system ("MEMS") display panel. When the non-self-luminescent type display panel is used, the display device 11 may further include a backlight unit that provides light to the display panel 200.

The display panel 200 includes a display area DA at which images are displayed and a non-display area NDA at which images are not displayed. As illustrated in FIG. 1, the non-display area NDA may surround the display area DA. The display area DA of the display panel 200 overlaps the light transmission portion TA of the window 100, and the non-display area NDA of the display panel 200 overlaps the light blocking portion BA of the window 100.

The housing 300 accommodates the display panel 200. The housing 300 may further accommodate a driver 260, circuit boards 261 and 271, and a power unit, which are provided to drive the display panel 200. The display device 11 according to an exemplary embodiment is described to include the housing 300 that is formed with a unitary single member accommodating the display panel 200. However, the exemplary embodiments are not limited thereto, and the display device 11 may include a housing formed with two or more members.

Figure 2:
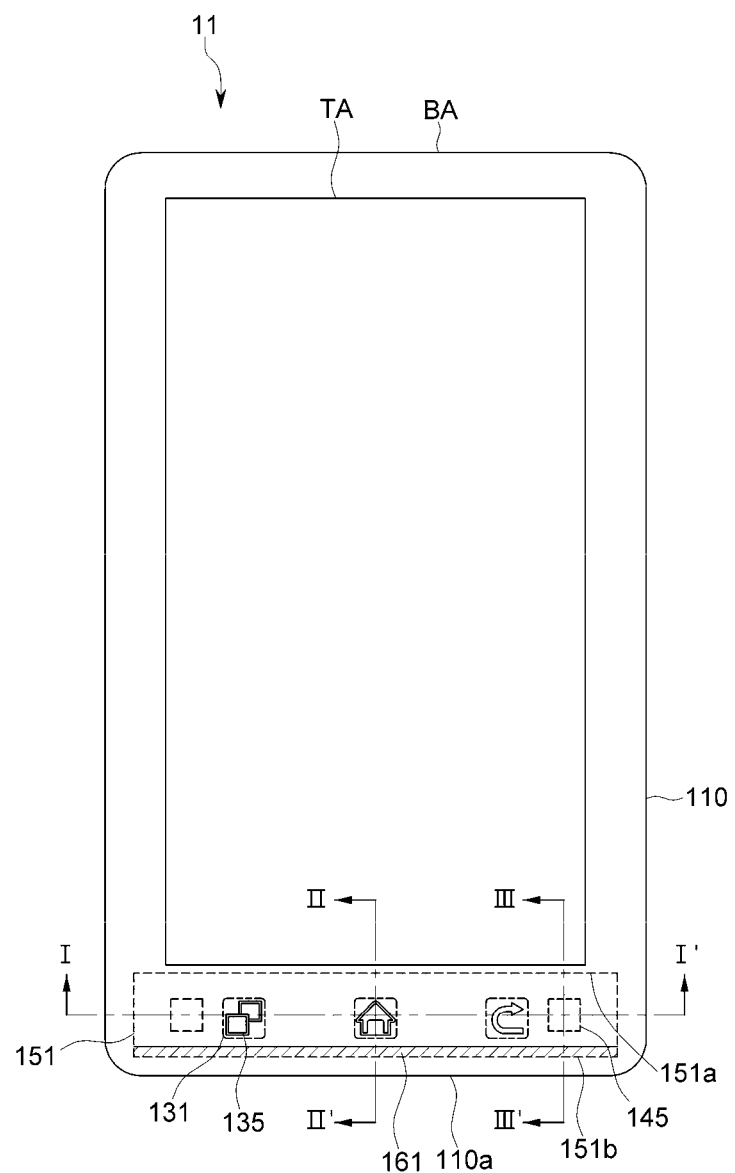
FIG. 2 is a plan view illustrating a display device according to an exemplary embodiment.
Figure 3:
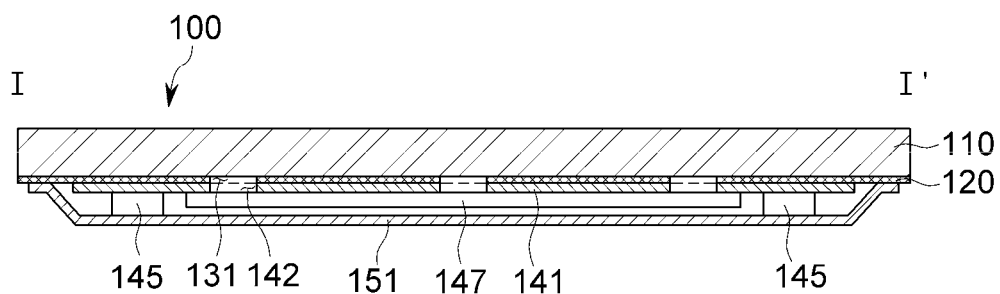
FIG. 3 is a cross-sectional view taken along sectional line I-I' of FIG. 2.
Figure 4:
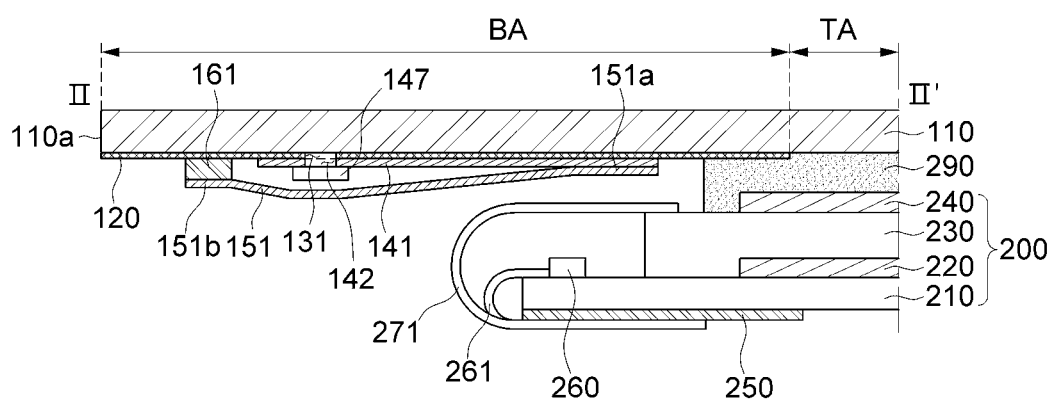
FIG. 4 is a cross-sectional view taken along sectional line II-II' of FIG. 2.
Figure 5:
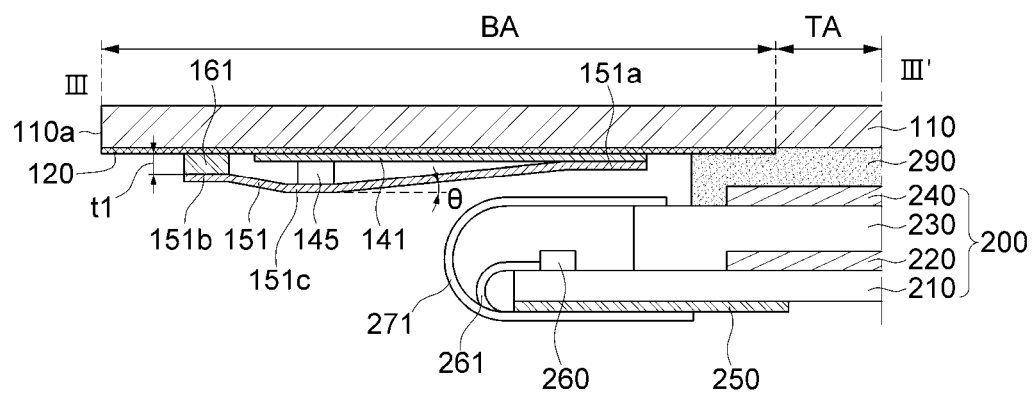
FIG. 5 is a cross-sectional view taken along sectional line III-III' of FIG. 2.

FIG. 2 is a plan view illustrating a display device according to an exemplary embodiment, FIG. 3 is a cross-sectional view taken along sectional line I-I' of FIG. 2, FIG. 4 is a cross-sectional view taken along sectional line II-II' of FIG. 2, and FIG. 5 is a cross-sectional view taken along line sectional III-III' of FIG. 2. The housing 300 is omitted in FIGS. 3, 4, and 5 for ease of description.

Referring to FIGS. 2, 3, 4, and 5, the window 100 of the display device 11 according to an exemplary embodiment includes a window base 110, a light blocking layer 120 including a touch key pattern portion 131, a printed circuit board 141, a touch key light source 145, a light guide film 147, a first light blocking member 151, and a second light blocking member 161.

The window base 110 has light transmittance. The window base 110 may include glass or a plastic material having impact resistance. For example, the window base 110 may include transparent glass that includes silicon oxide ($SiO_2$) as a main component.

The window base 110 includes a light transmission portion TA and a light blocking portion BA. The light blocking portion BA surrounds the light transmission portion TA on a plane. The light transmission portion TA of the window base 110 may correspond to an area where the light blocking layer 120 is not disposed, and the light blocking portion BA may correspond to an area where the light blocking layer 120 is disposed. In addition, the light transmission portion TA may correspond to the display area DA of the display panel 200, and the light blocking portion BA may correspond to the non-display area NDA of the display panel 200.

The light blocking layer 120 is disposed on one surface of the window base 110 that faces the display panel 200. The light blocking layer 120 has the touch key pattern portion 131 at which a touch icon 135 is located. The light blocking layer 120 may be disposed at an area of the light blocking portion BA of the window base 110 other than an area corresponding to the touch icon 135. For example, the light blocking layer 120 may be formed by printing a light blocking material in the remaining area except the light transmission portion TA and the touch icon 135. The light blocking material may have a black color or a specific color that may serve light blocking. Accordingly, light may be substantially prevented from leaking from the area other than the light transmission portion TA and the touch icon 135.

The printed circuit board 141 is disposed on one surface of the light blocking layer 120. The printed circuit board 141 may be attached to one surface of the light blocking layer 120 using a separate adhesive member. The printed circuit board 141 may include a touch electrode for sensing a touch signal transmitted through the touch key pattern portion 131 and at least one signal wire for applying power to the touch key light source 145. The printed circuit board 141 may be a flexible printed circuit board.

The printed circuit board 141 according to an exemplary embodiment has a light transmission hole 142 which overlaps the touch key pattern portion 131. That is, the light transmission hole 142 is located corresponding to the touch icons 135. The light transmission hole 142 has a size enough to surround the corresponding touch icon 135. The light emitted from the touch key light source 145 is transmitted to the touch key pattern portion 131 through the light transmission hole 142. Accordingly, light, in the shape of the touch icon 135, may be emitted to the outside of the window 100.

The touch key light source 145 is mounted at the printed circuit board 141. The touch key light source 145 may be a light emitting package including at least one light emitting diode ("LED"). For example, one light emitting package includes therein a red LED for emitting red light, a green LED for emitting green light, and a blue LED for emitting blue light, and may emit white light by combining the red, green, and blue lights. Alternatively, the light emitting package may only include a blue LED, and in such an exemplary embodiment, a phosphor for converting blue light into white light may be formed in a light emitting unit of the blue LED.

The touch key light source 145 may include two touch key light sources 145 that are spaced apart from each other with the touch key pattern portion 131 therebetween, but the exemplary embodiments are not limited thereto. In an exemplary embodiment, the display device 11 may include only one touch key light source 145, and may include three or more touch key light sources 145. Each light emitted from the two touch key light sources 145 is incident to the light guide film 147.

The light guide film 147 is disposed adjacent to the touch key light source 145 on one surface of the printed circuit board 141. For example, as illustrated in FIG. 3, the light guide film 147 may be disposed between the two touch key light sources 145. When one of a plurality of surfaces included in the light guide film 147 that faces the touch key light source 145 is referred to as a light incidence surface, the light emitted from the touch key light source 145 is incident to the light incidence surface and then proceeds to the inside of the light guiding film 147.

That is, the light emitted from the touch key light source 145 is transmitted to the touch key pattern portion 131 through the light guide film 147 and the light transmission hole 142, and accordingly, the light, in the shape of the touch icon 135, may be emitted to the outside of the window 100.

The light guide film 147 may include a light transmitting material, e.g., polycarbonate (PC) or an acrylic resin such as polymethylmethacrylate (PMMA), to guide light efficiently. In addition, a reflective sheet may be additionally disposed on one surface of the light guide film 147 to substantially minimize light loss, and an optical sheet may be additionally disposed between the light guide film 147 and the printed circuit board 141 to diffuse or collimate light.

The first light blocking member 151 is disposed overlapping the printed circuit board 141, the touch key light source 145, and the light guide film 147. The first light blocking member 151 may be an adhesive tape. For example, the first light blocking member 151 may be a black tape having adhesion.

For example, a surface of the first light blocking member 151 facing the window base 110 may have adhesion, and the one surface of the first light blocking member 151 having adhesion may include at least one of an acrylic resin, an epoxy resin, a fluororesin, and a polytetrafluoroethylene resin such as Teflon®.

The first light blocking member 151 includes opposite end portions 151a and 151b that oppose each other with the touch key light source 145 therebetween. One end portion 151a of the first light blocking member 151 is located between the touch key light source 145 and the light transmission portion TA, and the other end portion 151b of the first light blocking member 151 is located between the touch key light source 145 and an edge 110a of the window base 110. In such an exemplary embodiment, the edge 110a of the window base 110 refers to an edge of a plurality of edges of the window base 110 enclosing the light transmission portion TA that is adjacent to the touch key pattern portion 131 and the touch key light source 145.

The first light blocking member 151 has an inclination with respect to the window base 110 between the one end portion 151a of the first light blocking member 151 and the touch key light source 145. For example, as illustrated in FIG. 5, the one end portion 151a of the first light blocking member 151 is attached to the printed circuit board 141, and a central portion 151c of the first light blocking member 151 is attached to the touch key light source 145. In such an exemplary embodiment, the first light blocking member 151 has an inclination between the one end portion 151a and the central portion 151c due to a step difference between the printed circuit board 141 and the touch key light source 145. For example, the first light blocking member 151 may have an angle θ in a range from about 5 degrees to about 15 degrees with respect to a straight line parallel to the window base 110.

When the angle θ of the first light blocking member 151 with respect to the window base 110 is less than about 5 degrees, the one end portion 151a of the first light blocking member 151 may not be attached to the printed circuit board 141, thus causing light leakage between the first light blocking member 151 and the printed circuit board 141. On the other hand, when the angle θ of the first light blocking member 151 with respect to the window base 110 is more than about 15 degrees, the one end portion 151a of the first light blocking member 151 is located close to the touch key light source 145, and the first light blocking member 151 is bent at a relatively greater angle, and thus the first light blocking member 151 may be unstably attached to the printed circuit board 141. That is, when the angle θ of the first light blocking member 151 with respect to the window base 110 is in a range from about 5 degrees to about 15 degrees, the one end portion 151a of the first light blocking member 151 may be more stably attached to the printed circuit board 141 by being relatively further spaced apart from the touch key light source 145.

In other words, as the first light blocking member 151 according to an exemplary embodiment extends to one end portion of the printed circuit board 141 to be attached thereto with an inclination with respect to the window base 110, light leakage may be substantially prevented between the first light blocking member 151 and the printed circuit board 141, and the first light blocking member 151 may be more stably attached to the printed circuit board 141. Accordingly, the phenomenon in which the light emitted from the touch key light source 145 is visible to the user through the light transmission portion TA of the window base 110 may be substantially minimized.

In addition, as the first light blocking member 151 is inclined with respect to the window base 110, the one end portion 151a of the first light blocking member 151 may be disposed between the window base 110 and the display panel 200, and the touch key light source 145 may be disposed closer to the display panel 200. Accordingly, a planar area of a bezel area of the display device 11 may be reduced.

The second light blocking member 161 is disposed between the other end portion 151b of the first light blocking member 151 and the light blocking layer 120. Opposite surfaces of the second light blocking member 161 are attached to the other end portion 151b of the first light blocking member 151 and the light blocking layer 120, respectively. The second light blocking member 161 may be an adhesive tape. For example, the second light blocking member 161 may be a black light blocking tape having adhesion.

For example, at least one of opposite surfaces of the second light blocking member 161 may have adhesion, and the one surface of the second light blocking member 161 having adhesion may include at least one of an acrylic resin, an epoxy resin, a fluororesin, and a polytetrafluoroethylene resin such as Teflon®.

A thickness t1 of the second light blocking member 161 may be in a range from about 0.10 mm to about 0.80 mm. However, the exemplary embodiments are not limited thereto, and the thickness t1 of the second light blocking member 161 may be variously modified according to the design.

The display device 11 according to an exemplary embodiment may substantially prevent or reduce light leakage from occurring between the first light blocking member 151 and the light blocking layer 120 by including the second light blocking member 161 attached to the other end portion 151b of the first light blocking member 151 and the light blocking layer 120. Accordingly, the phenomenon in which the light emitted from the touch key light source 145 is visible to the user through the edge 110a of the window base 110 may be substantially minimized.

As illustrated in FIGS. 4 and 5, the display panel 200 according to an exemplary embodiment includes a base substrate 210, a display unit 220, an encapsulation layer 230, a touch sensing unit 240, a driver 260, a main printed circuit board 261, and a touch printed circuit board 271.

The base substrate 210 may be a plastic film having flexibility. For example, the base substrate 210 may include polyimide. However, the exemplary embodiments are not limited thereto, and the base substrate 210 may include an insulating material such as glass and quartz. The base substrate 210 may include a material selected from materials that have excellent mechanical strength, thermal stability, transparency, surface smoothness, ease of handling, water resistance, and the like.

At least one driver 260 is disposed on the base substrate 210. For example, the driver 260 may be mounted on the base substrate 210 in a chip on glass (COG) manner. The driver 260 may be disposed at the non-display area NDA of the display panel 200, and the driver 260 may be a driving integrated circuit ("IC").

The display unit 220 is formed on the base substrate 210, and is connected to the driver 260. The display unit 220 may include an organic light emitting diode ("OLED"). However, the exemplary embodiments are not limited thereto, and the display unit 220 may include liquid crystal molecules or an LED in place of the OLED.

The encapsulation layer 230 is disposed on the display unit 220. The encapsulation layer 230 covers and protects the display unit 220. A planar area of the encapsulation layer 230 may be less than a planar area of the base substrate 210. Accordingly, the driver 260 disposed on the base substrate 210 may be exposed by the encapsulation layer 230.

The encapsulation layer 230 may be an encapsulation substrate, an encapsulation film, or a thin film encapsulation layer. For example, when the encapsulation layer 230 is an encapsulation substrate, the encapsulation layer 230 may be bonded to the base substrate 210 using a sealant. In addition, when the encapsulation layer 230 is an encapsulation film, the encapsulation layer 230 may include one of a polyethylene (PET) film, a polypropylene (PP) film, a polyamide (PA) film, a polyacetal (POM) film, a poly methyl methacrylate (PMMA) film, a polybutylene terephthalate (PBT) film, a polycarbonate (PC) film, a cellulose film, and moisture-resistant cellophane. In addition, when the encapsulation layer 230 is a thin film encapsulation layer, the encapsulation layer 230 may include at least one inorganic layer and at least one organic layer that are alternately disposed.

The touch sensing unit 240 is disposed on the encapsulation layer 230. The touch sensing unit 240 may include a plurality of sensing electrodes crossing each other. The touch sensing unit 240 is used as an input means for the display device 11 and may be configured as a resistive type, a capacitive type, an optical type, a thermal type, an ultrasonic type, or the like. The plurality of sensing electrodes may be formed in an on-cell manner in which they are directly patterned on the encapsulation layer 230. However, the exemplary embodiments are not limited thereto, and the touch sensing unit 240 may be formed in an in-cell manner between the base substrate 210 and the encapsulation layer 230. In addition, the touch sensing unit 240 may be a separately manufactured touch panel.

In addition, a polarizer may be further disposed on the touch sensing unit 240 to reflect external light.

The main printed circuit board 261 is folded or routed to a back surface of the base substrate 210 while one side of the main printed circuit board 261 is connected to the driver 260 on the base substrate 210. A flexible printed circuit board may be used as the main printed circuit board 261.

The touch printed circuit board 271 is folded or routed to the back surface of the base substrate 210 while one side of the touch printed circuit board 271 is connected to the touch sensing unit 240 on the encapsulation layer 230. Another side of the touch printed circuit board 271 may be connected to the main printed circuit board 261. A flexible printed circuit board may be used as the touch printed circuit board 271.

The main printed circuit board 261 and the touch printed circuit board 271 may be attached to the back surface of the base substrate 210 using a double-sided tape 250.

The display device 11 according to an exemplary embodiment may further include an adhesive layer 290 disposed between the window 100 and the display panel 200. The adhesive layer 290 is disposed between the window 100 and the display panel 200 to firmly couple the window 100 and the display panel 200 together. The adhesive layer 290 may include a transparent polymer resin which has adhesion and is curable by light or heat. For example, the adhesive layer 290 may include a photocurable resin that is curable by light irradiation.

In particular, the adhesive layer 290 is located between the window base 110 and the touch sensing unit 240 to improve luminance, transmittance, reflectance, and visibility of the display device 11. The adhesive layer 290 substantially prevents or reduces generation of an air gap between the window 100 and the display panel 200 and substantially prevents or reduces foreign matter such as dust from penetrating therethrough.

The display device 11 according to an exemplary embodiment may substantially prevent or reduce the light emitted from the touch key light source 145 from being viewed through the light transmission portion TA of the window base 110 or the edge 110a of the window base 110 by including the first and second light blocking members 151 and 161 disposed on the light blocking portion BA of the window base 110.

Hereinafter, another exemplary embodiment will be described with reference to FIG. 6. The description of the same configuration as that of an exemplary embodiment will be omitted for convenience of explanation.

Figure 6:
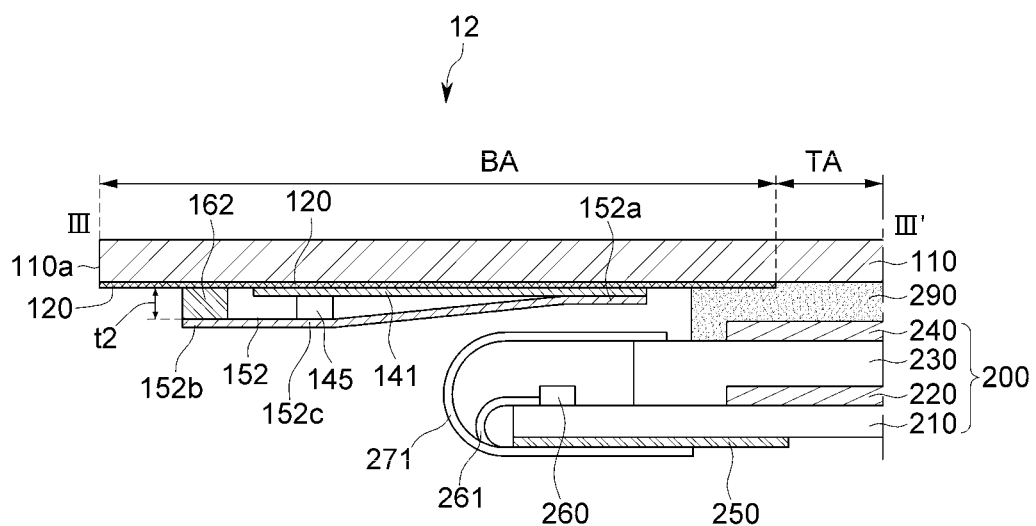
FIG. 6 is a cross-sectional view illustrating a display device according to another exemplary embodiment.

FIG. 6 is a cross-sectional view illustrating a display device according to another exemplary embodiment.

Referring to FIG. 6, a display device 12 according to another exemplary embodiment includes a second light blocking member 162 that has a thickness t2 substantially equal to a total thickness of a printed circuit board 141 and a touch key light source 145. For example, the thickness t2 of the second light blocking member 162 may be in a range from about 0.50 mm to about 0.75 mm. However, the exemplary embodiments are not limited thereto, and the thickness t2 of the second light blocking member 162 may be variously modified depending on the thicknesses of the printed circuit board 141 and the touch key light source 145.

A first light blocking member 152 includes opposite end portions 152a and 152b that oppose each other with the touch key light source 145 therebetween. One end portion 152a of the first light blocking member 152 is located between the touch key light source 145 and a light transmission portion TA, and the other end portion 152b of the first light blocking member 152 is located between the touch key light source 145 and an edge 110a of a window base 110. In such an exemplary embodiment, the edge 110a of the window base 110 refers to an edge of a plurality of edges of the window base 110 enclosing the light transmission portion TA that is adjacent to a touch key pattern portion 131 and the touch key light source 145.

The other end portion 152b of the first light blocking member 152 is attached to the second light blocking member 162, and a central portion 152c of the first light blocking member 152 is attached to the touch key light source 145. In such an exemplary embodiment, since there is no step difference between the second light blocking member 162 and the touch key light source 145, the first light blocking member 152 is disposed in parallel to the window base 110 between the other end portion 152b and the central portion 152c. Accordingly, the first light blocking member 152 may be more stably attached to the second light blocking member 162 and the touch key light source 145.

In addition, as the thickness t2 of the second light blocking member 162 increases, light leakage may be more effectively prevented between the first light blocking member 152 and the light blocking layer 120. Accordingly, the light emitted from the touch key light source 145 may be substantially prevented from being visible to the user through the edge 110a of the window base 110.

Hereinafter, another exemplary embodiment will be described with reference to FIGS. 7 and 8. The description of the same configuration as that of an exemplary embodiment will be omitted for convenience of explanation.

Figure 7:
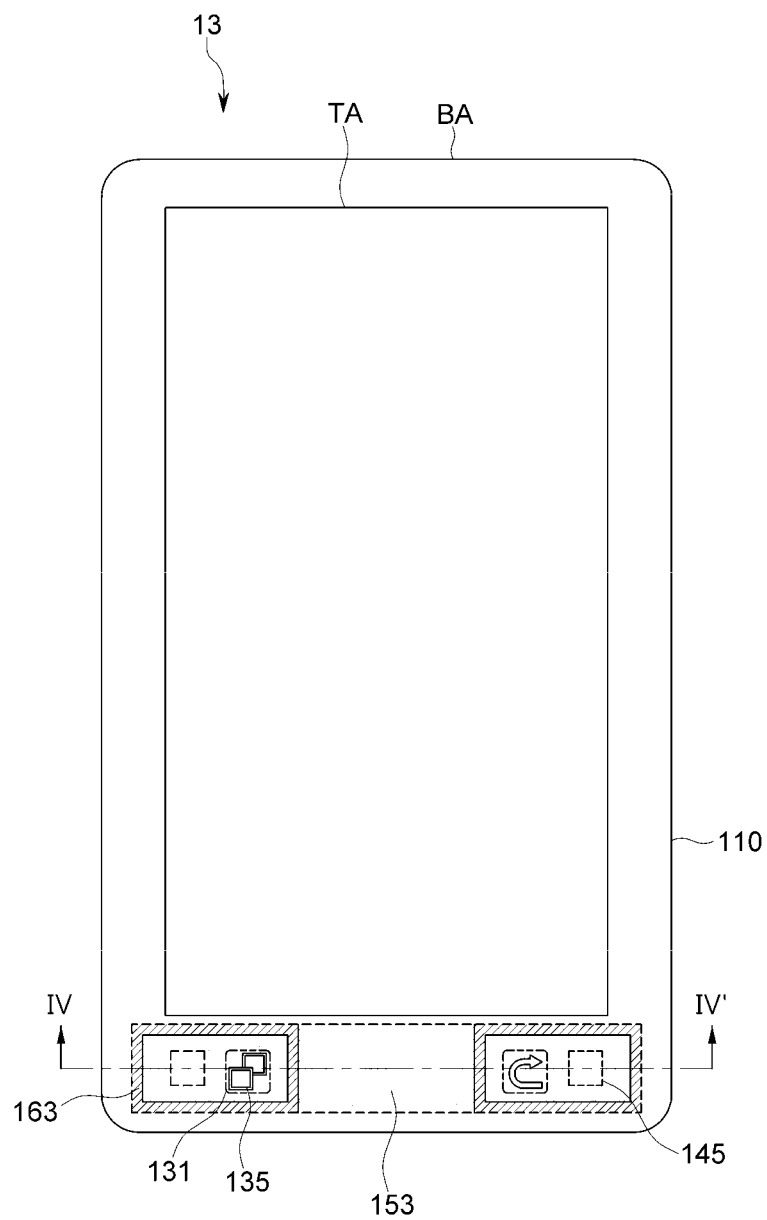
FIG. 7 is a plan view illustrating a display device according to another exemplary embodiment.
Figure 8:
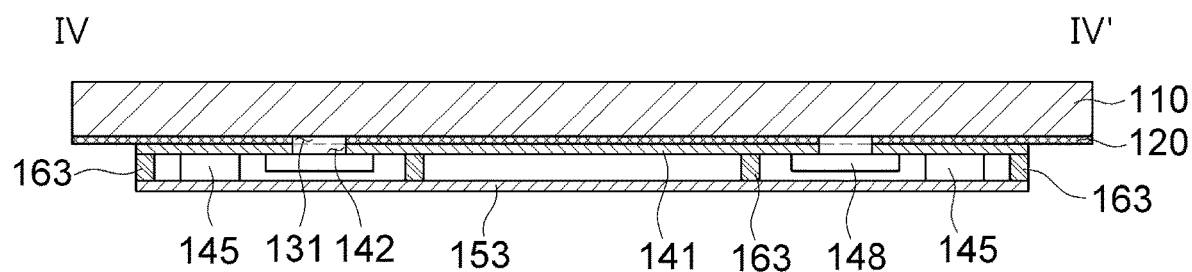
FIG. 8 is a cross-sectional view taken along sectional line IV-IV' of FIG. 7.

FIG. 7 is a plan view illustrating a display device according to another exemplary embodiment, and FIG. 8 is a cross-sectional view taken along sectional line IV-IV' of FIG. 7.

Referring to FIGS. 7 and 8, a display device 13 according to another exemplary embodiment includes a second light blocking member 163 that encloses a touch key pattern portion 131 and a touch key light source 145 in a plan view. In such an exemplary embodiment, the second light blocking member 163 may have a thickness substantially equal to a total thickness of a printed circuit board 141 and the touch key light source 145.

The second light blocking member 163 may form a closed loop in a plan view, and the closed loop may have a quadrangular shape, as illustrated in FIG. 7. However, the exemplary embodiments are not limited thereto, and the closed loop may have various shapes such as circular, polygonal, and irregular shapes.

A first light blocking member 153 is attached to the second light blocking member 163 and the touch key light source 145. In such an exemplary embodiment, since there is no step difference between the second light blocking member 163 and the touch key light source 145, the first light blocking member 153 is disposed in parallel to the window base 110. That is, the first light blocking member 153 does not include a bent portion. Accordingly, the first light blocking member 153 may be more stably attached to the second light blocking member 163 and the touch key light source 145.

In addition, a light guide film 148 may be enclosed by the closed loop defined by the second light blocking member 163 in a plan view. Accordingly, the amount of the light guide film 148 to be used may be reduced, and the manufacturing costs may be reduced.

Hereinafter, another exemplary embodiment will be described with reference to FIGS. 9 and 10. The description of the same configuration as that of an exemplary embodiment will be omitted for convenience of explanation.

Figure 9:
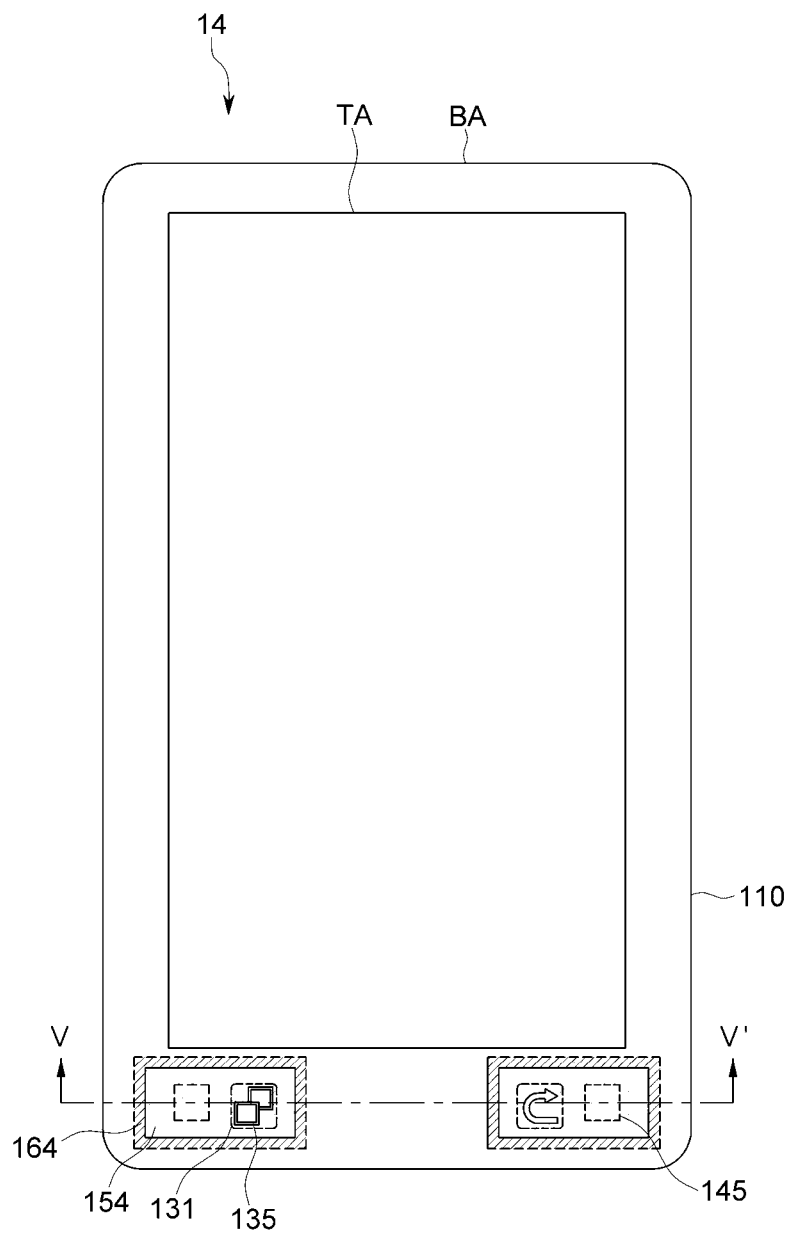
FIG. 9 is a plan view illustrating a display device according to another exemplary embodiment.
Figure 10:
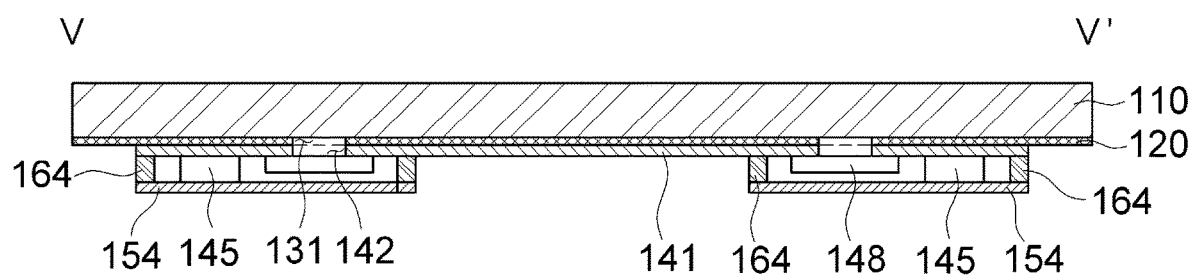
FIG. 10 is a cross-sectional view taken along sectional line V-V' of FIG. 9.

FIG. 9 is a plan view illustrating a display device according to another exemplary embodiment, and FIG. 10 is a cross-sectional view taken along sectional line V-V' of FIG. 9.

Referring to FIGS. 9 and 10, a display device 14 according to another exemplary embodiment includes a second light blocking member 164 that encloses a touch key pattern portion 131 and a touch key light source 145 in a plan view. In such an exemplary embodiment, the second light blocking member 164 may have a thickness substantially equal to a total thickness of a printed circuit board 141 and the touch key light source 145.

The second light blocking member 164 forms a closed loop in a plan view, and the closed loop may have a quadrangular shape, as illustrated in FIG. 9. However, the exemplary embodiments are not limited thereto, and the closed loop may have various shapes such as circular, polygonal, and irregular shapes.

A first light blocking member 154 is attached to the second light blocking member 164 and the touch key light source 145. In such an exemplary embodiment, since there is no step difference between the second light blocking member 164 and the touch key light source 145, the first light blocking member 154 is disposed in parallel to the window base 110. That is, the first light blocking member 154 does not include a bent portion. Accordingly, the first light blocking member 154 may be more stably attached to the second light blocking member 164 and the touch key light source 145.

In addition, as illustrated in FIGS. 9 and 10, the first light blocking member 154 of the display device 14 according to another exemplary embodiment may have a shape substantially the same as a shape of the area defined by the second light blocking member 164 in a plan view. That is, the first light blocking member 154 may not be disposed on the outside of the closed loop defined by the second light blocking member 164 in a plan view. Accordingly, the amount of the first light blocking member 154 to be used may be reduced, and the manufacturing costs may be reduced.

Hereinafter, another exemplary embodiment will be described with reference to FIG. 11. The description of the same configuration as that of an exemplary embodiment will be omitted for convenience of explanation.

Figure 11:
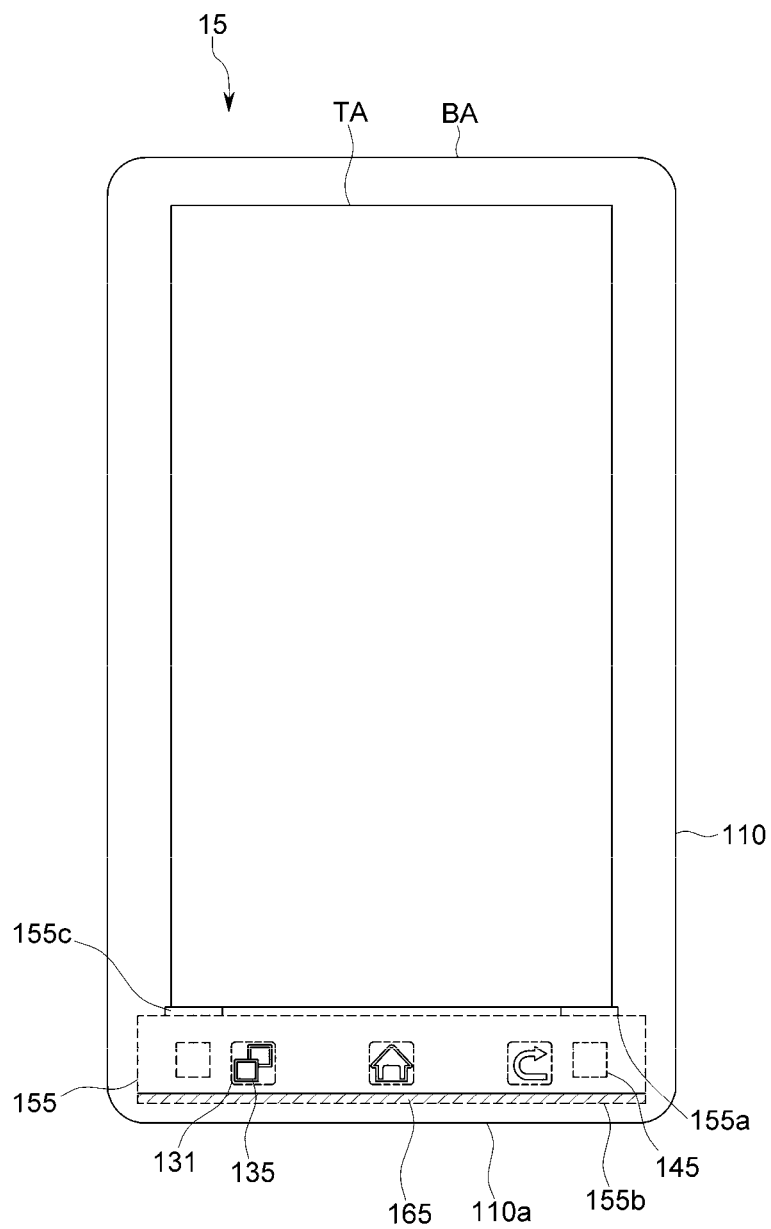
FIG. 11 is a plan view illustrating a display device according to another exemplary embodiment.

FIG. 11 is a plan view illustrating a display device according to another exemplary embodiment.

Referring to FIG. 11, a first light blocking member 155 of a display device 15 according to another exemplary embodiment includes opposite end portions 155a and 155b that oppose each other with a touch key light source 145 therebetween. One end portion 155a of the first light blocking member 155 is located between the touch key light source 145 and a light transmission portion TA, and the other end portion 155b of the first light blocking member 155 is located between the touch key light source 145 and an edge 110a of a window base 110.

In addition, the first light blocking member 155 further includes a protruding portion 155c that protrudes from the one end portion 155a of the first light blocking member 155 toward the light transmission portion TA, between the touch key light source 145 and the light transmission portion TA. An attachment area of the first light blocking member 155 between the touch key light source 145 and the light transmission portion TA may be larger than an attachment area of the first light blocking member 155 in other area.

As the display device 15 according to another exemplary embodiment includes the first light blocking member 155 that extends relatively long between the touch key light source 145 and the light transmission portion TA, the phenomenon in which light emitted from the touch key light source 145 is visible to the user through the light transmission portion TA of the window base 110 may be substantially minimized or reduced.

Hereinafter, another exemplary embodiment will be described with reference to FIG. 12. The description of the same configuration as that of an exemplary embodiment will be omitted for convenience of explanation.

Figure 12:
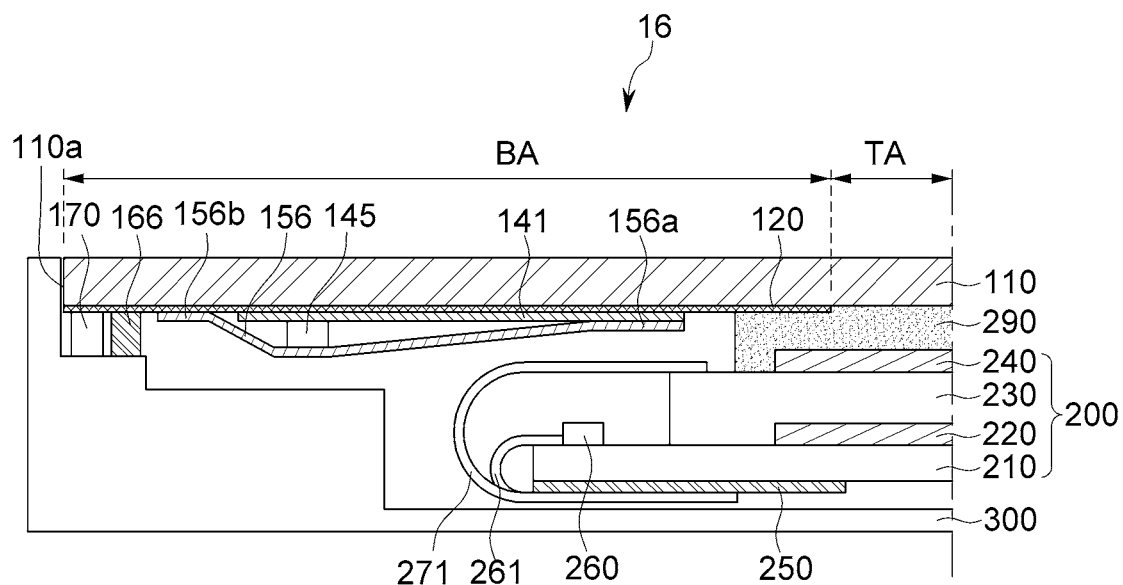
FIG. 12 is a cross-sectional view illustrating a display device according to another exemplary embodiment.

FIG. 12 is a cross-sectional view illustrating a display device according to another exemplary embodiment.

Referring to FIG. 12, a display device 16 according to another exemplary embodiment includes a first light blocking member 156, a second light blocking member 166, and an adhesive 170.

The first light blocking member 156 is disposed overlapping a printed circuit board 141, a touch key light source 145, and a light guide film 147 (see FIG. 3). The first light blocking member 156 may be an adhesive tape. For example, the first light blocking member 156 may be a black tape having adhesion.

The first light blocking member 156 includes opposite end portions 156a and 156b that oppose each other with the touch key light source 145 therebetween. One end portion 156a of the first light blocking member 156 is located between the touch key light source 145 and a light transmission portion TA, and the other end portion 156b of the first light blocking member 156 is located between the touch key light source 145 and an edge 110a of a window base 110. The one end portion 156a of the first light blocking member 156 is attached to the printed circuit board 141, and the other end portion 156b of the first light blocking member 156 is attached to a light blocking layer 120.

The second light blocking member 166 is disposed between a housing 300 and the light blocking layer 120, which is dissimilar to an exemplary embodiment. Opposite surfaces of the second light blocking member 166 are attached to the housing 300 and the light blocking layer 120, respectively. The second light blocking member 166 may be an adhesive tape. For example, the second light blocking member 166 may be a black light blocking tape having adhesion.

The adhesive 170 is disposed adjacent to the second light blocking member 166, between the housing 300 and the light blocking layer 120. In addition, the adhesive 170 is disposed between the edge 110a of the window base 110 and the second light blocking member 166. The adhesive 170 may be a black adhesive for substantially preventing or reducing light leakage. In addition, the adhesive 170 may be a curable adhesive 170. For example, the adhesive 170 may include at least one of, for example, an epoxy resin composition, a silicone resin composition, a modified epoxy resin composition such as a silicone-modified epoxy resin, a modified silicone resin composition such as an epoxy-modified silicone resin, a polyimide resin composition, a modified polyimide resin composition, polyphthalamide (PPA), a polycarbonate resin, polyphenylene sulfide (PPS), liquid crystal polymer (LCP), an ABS resin, a phenol resin, an acrylic resin, and a PBT resin.

As the display device 16 according to another exemplary embodiment includes the second light blocking member 166 and the adhesive 170 attached to the housing 300 and the light blocking layer 120, the phenomenon in which light emitted from the touch key light source 145 is visible to the user through the edge 110a of the window base 110 may be substantially minimized or reduced.

As set forth hereinabove, according to one or more embodiments, the display device may substantially prevent or reduce light leakage caused by the touch key light source, by including the first and second light blocking members.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a display panel; and
   a window disposed on the display panel, the window comprising:
   a window base comprising a light transmission portion and a light blocking portion;
   a light blocking layer disposed on the light blocking portion of the window base, the light blocking layer comprising a touch key pattern portion;
   a printed circuit board disposed on the light blocking layer;
   a touch key light source disposed on the printed circuit board;
   a first light blocking member disposed on the printed circuit board and the touch key light source, the first light blocking member comprising:
      a first distal end located between the touch key light source and the light transmission portion of the window base; and
      a second distal end located between the touch key light source and an edge of the window base; and
   a second light blocking member disposed between the second distal end of the first light blocking member and the light blocking layer.

2. The display device of claim 1, wherein the first distal end of the first light blocking member is attached to the printed circuit board, and the second distal end of the first light blocking member is attached to the second light blocking member.

3. The display device of claim 1, wherein each of the first and second light blocking members comprises a black adhesive tape.

4. The display device of claim 1, wherein at least one surface of each of the first and second light blocking members comprises at least one of an acrylic resin, an epoxy resin, a fluororesin, and a polytetrafluoroethylene resin.

5. The display device of claim 1, wherein the first light blocking member has an angle in a range from about 5 degrees to about 15 degrees with respect to the window base, between the first distal end of the first light blocking member and the touch key light source.

6. The display device of claim 1, wherein the first distal end of the first light blocking member overlaps at least a part of the display panel.

7. The display device of claim 1, wherein the second light blocking member has a thickness in a range from about 0.10 mm to about 0.80 mm.

8. The display device of claim 7, wherein the second light blocking member has a thickness substantially equal to a total thickness of the printed circuit board and the touch key light source.

9. The display device of claim 8, wherein the second light blocking member has a thickness in a range from about 0.50 mm to about 0.75 mm.

10. The display device of claim 1, wherein the second light blocking member encloses the touch key light source and the touch key pattern portion in a plan view.

11. The display device of claim 10, wherein the first distal end and the second distal end of the first light blocking member are attached to the second light blocking member.

12. The display device of claim 10, wherein the first light blocking member has a shape substantially the same as a shape of an area defined by the second light blocking member.

13. The display device of claim 1, wherein the first light blocking member further comprises a protruding portion that protrudes from the first distal end of the first light blocking member toward the light transmission portion of the window base, interposed between the touch key light source and the light transmission portion of the window base.

14. The display device of claim 1, wherein the touch key light source comprises two touch key light sources spaced apart from each other with the touch key pattern portion therebetween, and
   wherein the display device further comprises a light guide film disposed between the two touch key light sources.

15. The display device of claim 14, wherein the light guide film overlaps the touch key pattern portion.

16. A display device comprising:
   a display panel;
   a window disposed on the display panel; and
   a housing accommodating the display panel,
   wherein the window comprises:
   a window base comprising a light transmission portion and a light blocking portion;
   a light blocking layer disposed on the light blocking portion of the window base, the light blocking layer comprising a touch key pattern portion;
   a printed circuit board disposed on the light blocking layer;
   a touch key light source disposed on the printed circuit board;
   a first light blocking member disposed on the printed circuit board and the touch key light source, the first light blocking member comprising:
      a first distal end located between the touch key light source and the light transmission portion of the window base; and
      a second distal end located between the touch key light source and an edge of the window base; and
   a second light blocking member disposed between the housing and the light blocking layer.

17. The display device of claim 16, wherein the first distal end of the first light blocking member is attached to the printed circuit board, and the second distal end of the first light blocking member is attached to the light blocking layer.

18. The display device of claim 16, wherein each of the first and second light blocking members comprises a black adhesive tape.

19. The display device of claim 16, further comprising an adhesive disposed adjacent to the second light blocking member, between the housing and the light blocking layer.

20. The display device of claim 19, wherein the adhesive is a black adhesive and comprises a curable material.

\* \* \* \* \*